(12) United States Patent
Hayashi (10) Patent No.: US 7,723,221 B2
(45) Date of Patent: May 25, 2010

(54) STACKED FILM PATTERNING METHOD AND GATE ELECTRODE FORMING METHOD

(75) Inventor: Kenichi Hayashi, Tokyo (JP)

(73) Assignees: NEC Corporation, Tokyo (JP); NEC LCD Technologies, Ltd., Kanagawa (JP)

( * ) Notice: Subject to any disclaimer, the term of this patent is extended or adjusted under 35 U.S.C. 154(b) by 36 days.

(21) Appl. No.: 11/803,242

(22) Filed: May 14, 2007

(65) Prior Publication Data

US 2007/0269938 A1 Nov. 22, 2007

(30) Foreign Application Priority Data

May 16, 2006 (JP) .............................. 2006-137112

(51) Int. Cl.
*H01L 21/3205* (2006.01)
(52) U.S. Cl. .................... 438/585; 438/704; 438/734; 257/E21.176; 257/E21.229
(58) Field of Classification Search ................ 438/585, 438/704, 734; 257/E21.179, E21.229
See application file for complete search history.

(56) References Cited

U.S. PATENT DOCUMENTS 5,431,770 A * 7/1995 Lee et al. ..................... 438/592
7,012,029 B2 * 3/2006 Katoh et al. ................. 438/738
7,208,424 B2 * 4/2007 Stephens et al. ............. 438/720
7,323,403 B2 * 1/2008 Rotondaro et al. ........... 438/585

FOREIGN PATENT DOCUMENTS

| JP | 5-235353 | 9/1993 |
| JP | 5-283427 | 10/1993 |
| JP | 6-283547 | 10/1994 |
| JP | 11-307777 | 11/1999 |
| JP | 2001-274411 | 10/2001 |

* cited by examiner

*Primary Examiner*—Charles D Garber
*Assistant Examiner*—Stanetta D Isaac
(74) *Attorney, Agent, or Firm*—Scully, Scott, Murphy & Presser, P.C.

(57) ABSTRACT

A stacked film patterning method is provided which is capable of reliably removing residual substances remaining after etching of a metal film, improving etching uniformity of a silicon film, and preventing an occurrence of etching residues. A micro-crystal film and a chromium film are sequentially formed on an insulating film serving as a front-end film and the chromium film is etched to be patterned by using a resist as a mask. Next, a micro-crystal silicon film on which the residual substances exist is exposed to plasma of a mixed gas including chlorine gas and oxygen gas to selectively etch the residual substances on a surface of the micro-crystal silicon film. After that, the micro-crystal silicon film is dry etched.

7 Claims, 7 Drawing Sheets

STACKED FILM PATTERNING METHOD AND GATE ELECTRODE FORMING METHOD

INCORPORATION BY REFERENCE

This application is based upon and claims the benefit of priority from Japanese Patent Application No. 2006-137112, filed on May 16, 2006, the disclosure of which is incorporated herein in its entirely by reference.

BACKGROUND OF THE INVENTION

1. Field of the Invention

The present invention relates to a stacked film patterning method and a gate electrode forming method and more particularly to the stacked film patterning method to be used in manufacturing of, for example, a TFT (Thin Film Transistor) substrate making up a liquid crystal display device and to be used when a stacked film with a two-layer structure configured by stacking a metal film on a silicon film is formed as, for example, an electrode layer and to the method of forming the gate electrode of, for example, the TFT.

2. Description of the Related Art

Conventionally, a structure of a TFT is classified into two types, one being of a bottom-gate type to be used mainly in an amorphous silicon TFT and the other being of a top-gate type to be used mainly in a polycrystalline silicon TFT. As a gate electrode for the top-gate TFT, a single layer of each of a silicon film, metal film, metal silicide film is used, however, additional technology is proposed in which the gate electrode is constructed by using a stacked film made up of a metal film or metal silicide film deposited on a silicon film in order to increase reliability and to use resistors of lower resistance.

That is, the technical proposal includes the use of a stacked film made up of, for example, a metal silicide film formed on a polycrystalline silicon film (for example, Japanese Patent Application Laid-open No. Hei 05-235353), or a stacked film made up of a metal film or metal silicide film formed on a micro-crystal silicon film (for example, No. Hei 11-307777). In the above Japanese Patent Application Laid-open Nos. Hei 05-235353 and Hei 11-307777, when a gate electrode is formed by patterning, a dry etching process is carried out on both a metal material making up a metal film or metal silicide film serving as an upper layer and a silicon material making up a polycrystalline silicon film or micro-crystal silicon film serving as a lower layer.

However, the metal material includes a material having a low etching rate for dry etching or the material being prone to produce trash caused by a reaction product accumulated in a chamber during dry etching and, therefore, in some cases, use of a wet etching method rather than the dry etching method at a time when patterning is performed on the metal film is advantageous in terms of productivity.

For example, in the case of a chromium film, etching rate by dry etching is about 40 nm/min, whereas an etching rate by wet etching using, for example, an ammonium cerium nitrate etching solution is about 100 nm/min. Therefore, when a stacked film made up of a chromium film is formed on a silicon film and a gate electrode is formed by patterning, by using the wet etching method to etch the chromium film and by using the dry etching method to etch the silicon film, a throughput (processing capability) can be raised.

Figure 7A:
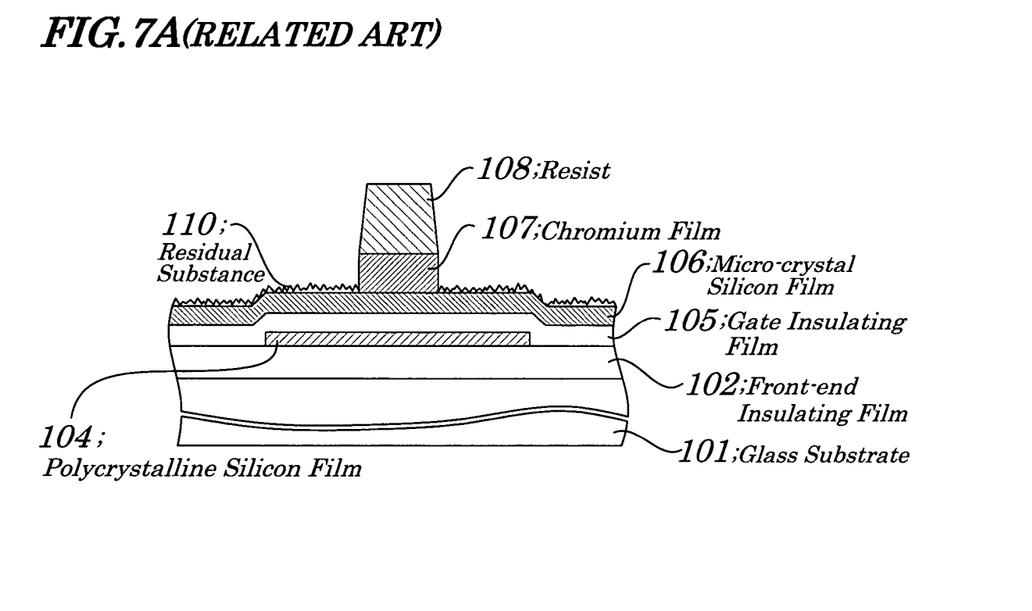
FIGS. 7A and 7B are diagrams explaining conventional technology for manufacturing polycrystalline silicon TFTs.

However, the method in which, after the wet-etching of the chromium film, the silicon film is dry etched has a problem; that is, an etching residue occurring after the wet-etching of the chromium film inhibits the dry-etching of the silicon film and, as a result, etching uniformity deteriorates and a residue of silicon occurs. The problem that etching uniformity deteriorates and the residue occurs when a gate electrode of a top-gate type polycrystalline silicon TFT is formed is explained together with an initial stage of manufacturing TFTs. First, as shown in FIG. 7A, a front-end insulating film 102 made of silicon dioxide or silicon nitride is deposited by plasma CVD so as to have a film thickness of about 300 nm on a glass substrate 101.

Next, an amorphous silicon film is deposited by plasma CVD on the front-end insulating film 102 so as to have its film thickness of 50 nm. Then, a polycrystalline silicon film 104 is formed by radiating, for example, an excimer laser to crystallize the amorphous silicon film. Then, the polycrystalline silicon film 104 is patterned by the dry-etching method using the resist as a mask to form an island structure which serves as an active layer of the TFT.

Next, a gate insulating film 105 made of a silicon oxide film with its film thickness of about 100 nm is deposited by the plasma CVD on the polycrystalline silicon film 104 patterned so as to have the island structure. Then, an n-type microcrystal silicon film 106 with its film thickness of about 100 nm is formed which contains phosphorus (P) as an impurity and serves as a lower layer of a gate electrode 109. Next, a chromium film 107 is deposited so as to have its film thickness of about 200 nm by spattering, which serves as an upper layer of the gate electrode 109.

Then, the upper layer of the gate electrode 109 is formed by patterning the chromium film 107 and by wet-etching using, for example, an ammonium cerium nitrate etching solution and using the resist film 108 as a mask. Now, on a surface of the exposed micro-crystal silicon film 106 occur, in an ununiform state, residues of metal chromium remaining after the wet-etching and residual substances 110 being chromium silicide which are compounds of chromium with silicon.

Figure 7B:
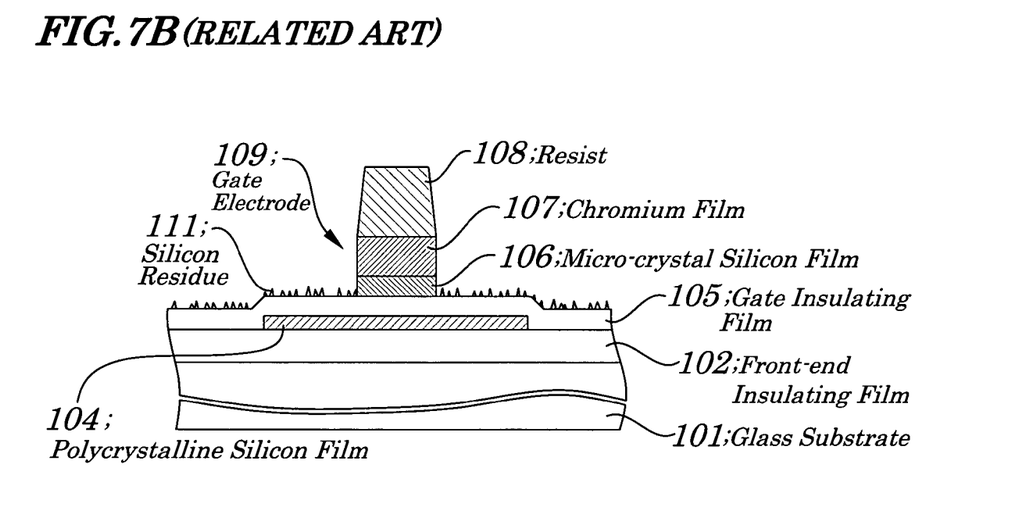

Next, as shown in FIG. 7B, the lower layer of the gate electrode 109 is formed by patterning the micro-crystal silicon film 106 using a dry-etching method. However, in a state in which the residues of metal chromium and/or the residual substances 110 being chromium silicide are left on the microcrystal silicon film 106, these substances act as a mask which impairs the progress of smooth etching. This causes the uniformity of etching to deteriorate and cylindrical residues 111 of silicon to occur. These residues 111 of silicon act as a barrier in an impurity implanting process and contact hole forming process to be performed thereafter, which inhibits the formation of a TFT having excellent characteristics.

To solve this problem, when a gate electrode is formed by patterning a stacked film made up of a silicon film and metal film and by combined use of the wet-etching and dry-etching methods, in order to prevent etching failures, technology is proposed which includes a process of removing residual substances that inhibit the smooth etching is required after the wet-etching of the metal film and before the dry-etching of the silicon film.

The method to remove such residual substances as described above includes a method of performing an etching process using plasma of, for example, oxygen gas (for example, Japanese Patent Application Laid-open No. Hei 05-283427), a method of performing a wet-etching process using a solution including hydrofluoric acid or of performing a sputter-etching process using plasma of inert gas such as argon or a like (for example, Japanese Patent Application Laid-open No. Hei 06-283547), and a method of performing an etching process using plasma of a mixed gas including methane trifluoride ($CHF_3$) gas and oxygen gas (for example, Japanese Patent Application Laid-open No. 2001-274411).

The purpose of the technologies disclosed in the above Japanese Patent Application Laid-open Nos. Hei 05-283427, Hei 06-283547, and 2001-274411 is to prevent the occurrence of etching failures caused by residual substances when, in a bottom-gate type amorphous silicon TFT, an n-type amorphous silicon film of a back channel is to be removed by a dry-etching method after source/drain electrodes made of a metal film is formed by a wet-etching method.

However, the conventional technologies have problems. A first problem to be solved is that, in the above conventional technology, residual substances remaining after etching a metal film cannot be removed satisfactorily and, as a result, etching uniformity of a silicon film deteriorates and residues of etching occur. For example, even if the technology disclosed in the Japanese Patent Application Laid-open No. Hei 05-283427 is used, it is impossible to remove residual substances by etching.

That is, since a vapor pressure of an oxide of metal or silicon is low, the removal of residual substances by etching using only plasma of oxygen is impossible. Moreover, by the repetition of both the oxygen plasma processing and subsequent silicon film etching processes, oxygen and an residual amount of gas used for etching the silicon film are mixed and, as a result, though the effect of removing residual substances appears, the residual amount of the gas used for etching the silicon film, decreases during the evacuation and oxygen plasma processing to be carried out before subsequent processing on a substrate starts and the capability of removing the residual substances becomes unstable and the effect of removing residual substances decreases with passage of processing time.

Also, when the technology disclosed in the above Japanese Patent Application Laid-open No. 2001-274411 is applied to the formation of a gate electrode of a top-gate type polycrystalline TFT, the residual substances cannot be fully removed in patterning of a stacked film made up of a metal film formed on a polycrystalline silicon film or micro-crystal silicon film having a crystalline property being higher than that of amorphous silicon. That is, the polycrystalline silicon film or micro-crystal silicon film are films made up of small crystals gathered together on which fine concave and/or convex portions derived from the crystalline property appear. Additionally, in a region in which the polycrystalline silicon film serving as the active layer exists with the gate insulating film being interposed between the micro-crystal silicon film and the polycrystalline silicon film under the gate electrode of the top-gate polycrystalline TFT, concave and/or convex portions occurring on the surface of the silicon film of the gate electrode are big in size and complicated in shape.

Thus, when the metal film formed on the silicon film on the surface of which fine concave and/or convex portions exist is formed by patterning using the wet-etching method, many residual substances occur on the exposed surface of the silicon film and non-silicidized residual substances in a metal state increase. If residual substances increase, even by the etching process using plasma of a mixed gas including $CHF_3$ gas and oxygen gas, it is impossible to fully remove residual substances. For example, when the metal film is a chromium film, since a vapor pressure of a fluoric compound with chromium is low, almost no residual substances left in a metal state can be removed.

A second problem to be solved is that the above conventional technology causes a decrease in throughput. For example, in the conventional technology disclosed in the above Japanese Patent Application Laid-open No. Hei 06-283547, successive processes of the wet-etching process using the solution including hydrofluoric acid and the subsequent process of etching the silicon film are impossible, which causes a decrease in throughput.

Moreover, a third problem to be solved is that, in the conventional technology, etching of a region that should be left without being etched or a similar unexpected matter occurs; that is, by the conventional technology, exact removal of residual substances is impossible. For example, in the conventional technology disclosed in the above Japanese Patent Application Laid-open No. Hei 06-283547, when the wet-etching process is performed using the solution including hydrofluoric acid, if the solution being highly capable of removing residual substances of metal and/or metal silicide is used, a phenomenon of side-etching of a metal film occurs during the process, which also makes it impossible to maintain a desired pattern shape of the metal film.

Furthermore, when a sputter-etching process using plasma of inert gas such as argon is performed, in order to prevent the degradation of a peeling property caused by damage in a resist, removal of the resist before the sputter-etching process is required. At this point of time, a surface portion of a metal film in a region to be left as a pattern without being etched at the time of sputter-etching process is erroneously etched. Since anisotropy is very strong in the sputter-etching, in a place where steps exist, removal of residual substances existing on a side of the step portion is difficult.

SUMMARY OF THE INVENTION

In view of the above, it is a first object of the present invention to provide a stacked film patterning method and a gate electrode forming method which are capable of reliably removing residual substances remaining after etching of a metal film, improving etching uniformity of a silicon film, preventing the occurrence of an etching residue, and obtaining a TFT (Thin Film Transistor) having high reliability and excellent characteristics. It is a second object of the present invention to provide the stacked film patterning method and the gate electrode forming method which are capable of effectively removing residual substances remaining after etching of the metal film and of maintaining a high throughput. It is a third object of the present invention to provide the stacked film patterning method and the gate electrode forming method which are capable of preventing inconvenience of etching a region that needs to be left without being etched and accurately removing residual substances remaining after etching the metal film and of obtaining the TFT having high reliability and excellent characteristics.

According to a first aspect of the present invention, there is provided a stacked film patterning method for obtaining a desired stacked film pattern by etching a lower layer film made of a conductive semiconductor and an upper layer film made of metal, the method including:

a first etching process of removing a specified region of the upper layer film made of the metal;

a second etching process of removing residues of the metal and/or a compound of the metal with the conductive semiconductor by using plasma of a mixed gas including chlorine gas and oxygen gas after completion of the first etching process; and a third etching process of the lower layer film made of the conductive semiconductor after completion of the second etching process.

By configuring as above, in the second process, residual substances remaining after the etching of the upper layer are removed by using plasma of the mixed gas including chlorine and oxygen and, therefore, it is made possible to improve etching uniformity of the lower layer and to prevent the occurrence of etching residues.

According to a second aspect of the present invention, there is provided a stacked film patterning method for obtaining a desired stacked film pattern by etching a stacked film including a lower layer film made of a conductive semiconductor and an upper layer film made of metal, the method including:

a first etching process of removing a specified region of the upper layer film made of the metal by using a wet-etching method;

a second etching process of removing residues of the metal or a compound of the metal with the conductive semiconductor by using plasma of a mixed gas including chlorine gas and oxygen gas after completion of the first etching process; and a third etching process of removing the lower layer film made of the conductive semiconductor by using a dry-etching method after completion of the second etching process.

By configuring as above, in the first process, the upper layer film is etched by using the wet-etching method and, in the second process, the etching residues are removed by the plasma of the mixed gas including chlorine gas and oxygen gas and, in the third process, the lower layer film is etched by the dry-etching method and, therefore, the residual substances remaining after the etching of the upper layer film are reliably removed which improves etching uniformity of the lower layer film and prevents the occurrence of etching residues.

In the foregoing, a preferable mode is one wherein the lower layer film is made of polycrystalline silicon or micro-crystal silicon and the upper layer film is made of metal selected from a group of chromium, molybdenum, tungsten, and tantalum, or of an alloy including the metal.

By configuring as above, the polycrystalline silicon or the micro-crystal silicon is used as a material for the lower layer film and the metal selected from the group of chromium, molybdenum, tungsten, and tantalum, or the ally including the metal as chief constituents is used as a material for the upper layer film and, therefore, it is made possible to leave no residual substances on a surface of the lower layer film, thereby improving etching uniformity of the lower layer and preventing the occurrence of the etching residues.

Also, a preferable mode is one wherein a ratio of a flow rate of the oxygen gas to the chlorine gas is set to be within a range between 30% and 300%.

By configuring as above, the ratio of the flow rate of the oxygen gas to the chlorine gas in the mixed gas is set to be with in a range between 30% and 300% and, therefore, the residual substances on the surface of the lower layer film are selectively etched, thereby improving etching uniformity of the lower layer film and preventing the occurrence of the etching residues.

Also, a preferable mode is one wherein the ratio of the flow rate is set to be within a range between 50% and 200%.

By configuring as above, the ratio of the flow rate of the oxygen gas to the chlorine gas in the mixed gas is set to be within a range between 50% and 200%, thereby improving etching uniformity of the lower layer film and preventing the occurrence of the etching residues.

According to a third aspect of the present invention, there is provided a gate electrode forming method for obtaining a desired gate electrode pattern by forming a stacked film including a lower layer film made of a conductive semiconductor and an upper layer film made of metal on a semiconductor film and gate insulating film deposited sequentially on a substrate and by etching the stacked film, the method including:

a first etching process of removing a specified region of the upper layer film made of the metal;

a second etching process of removing residues of the metal or a compound of the metal with the conductive semiconductor by using plasma of a mixed gas including chlorine gas and oxygen gas after completion of the first etching process; and a third process of removing the lower layer film made of the polycrystalline silicon after completion of the second etching process.

By configuring as above, in the process of forming the gate electrode, even when much metal is contained in the residual substances remaining after the etching of the upper layer film caused by increased concave and convex portions on the surface of the lower layer film making up the gate electrode under the influence of the concave and convex portions on the surface of the semiconductor in the region where the semiconductor film of the active layer exists in the lower portion, etching is performed by using the plasma of the mixed gas including chlorine gas and oxygen gas and, therefore, the residual substances are removed, thereby improving etching uniformity of the lower layer film and preventing the occurrence of the etching residues.

According to a fourth aspect of the present invention, there is provided a gate electrode forming method for obtaining a desired gate electrode pattern by forming a stacked film including a lower layer film made of a conductive semiconductor and an upper layer film made of metal on a semiconductor film and gate insulating film deposited sequentially on a substrate and by etching the stacked film, the method including:

a first etching process of removing a specified region of the upper layer film made of the metal by using a wet-etching method;

a second etching process of removing residues of the metal or a compound of the metal with the conductive semiconductor by using plasma of a mixed gas including chlorine gas and oxygen gas after completion of the first etching process; and a third etching process of removing the lower layer film made of the conductive semiconductor by using a dry-etching method after completion of the second etching process.

By configuring as above, in the process of forming the gate electrode, even when much metal is contained in the residual substances remaining after the wet-etching of the upper layer film caused by increased concave and convex portions on the surface of the lower layer film making up the gate electrode under the influence of the concave and convex portions on the surface of the semiconductor in the region where the semiconductor film of the active layer exists in the lower portion, etching is performed by using the plasma of the mixed gas including chlorine gas and oxygen gas and, therefore, the residual substances are removed, thereby improving etching uniformity of the lower layer film and preventing the occurrence of the etching residues.

With the above configuration, in the first etching process, a specified region of the upper layer made of the metal is removed and, after the completion of the first etching process, in the second etching process, the residues of the metal and/or compounds of the metal with the conductive semiconductor are removed by using the plasma of the mixed gas including chlorine gas and oxygen gas and, after the completion of the second etching process, in the third process, the lower layer made of the conductive semiconductor is removed and, therefore, the residual substances remaining after the etching of the upper layer can be removed with reliability which achieves etching uniformity of the lower layer and inhibits the occurrence of the etching residues and, as a result, TFTs having high reliability and excellent characteristics can be obtained.

That is, the etching using plasma including chlorine and oxygen is highly capable of removing not only a compound of metal with a conductive semiconductor but also metal itself and, therefore, even when excessive metal residues remain after the etching of the metal film caused by fine concave and/or convex portions on the surface of the conductive semiconductor film, by etching using the plasma including chlorine and oxygen before the dry-etching of the conductive semiconductor film, the residual substances interfering with etching the surface of the conductive film can be reliably removed, thereby improving the etching uniformity of the conductive semiconductor film and preventing the occurrence of the etching residues.

Moreover, when the lower film is etched by the dry-etching method, both the process of etching at least an interface region between the lower layer and upper layer by exposure the region to an atmosphere of the plasma including chlorine and oxygen and the process of etching the lower layer can be performed successively by using the same dry-etching apparatus and, therefore, residual substances remaining after the etching of the upper layer can be effectively removed and a high throughput can be maintained.

Furthermore, since the etching using plasma provides comparatively high anisotropy, a progress of a side-etching phenomenon on the metal film can be inhibited and, since the etching using plasma causes comparatively less damage to the resist, removal of the resist after the wet-etching of the metal film and before the etching using plasma is not required. Moreover, since the etching using plasma provides some isotropy, even in a region where step-differences exist, residual substances on a side of the step portions can be removed, which enables accurate removal of the residual substances remaining after the etching of the metal film. As a result, TFTs having, for example, high reliability and excellent characteristics can be obtained.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying but the present invention will be described in further detail using various embodiments with reference to the accompanying drawings. According to the present invention, by removing a specified region of an upper layer made of metal in the first etching process and by removing metal and/or a compound of metal with a conductive semiconductor using plasma of mixed gas including chlorine gas and oxygen gas in the second etching process after the completion of the first etching process, and further by removing a lower layer made of a conductive semiconductor in the third etching process after the completion of the second etching process, the first purpose of removing residual substances remaining after the etching of the upper layer with reliability and improving etching uniformity of the lower layer, preventing the occurrence of etching residues to obtain TFTs having, for example, high reliability and excellent characteristics is realized.

Moreover, by successively performing, when the lower film is etched by the dry-etching method, both the process of etching at lease an interface region between the lower layer and upper layer by exposure the region to an atmosphere of plasma including chlorine and oxygen and the process of etching the lower layer by using the same dry-etching apparatus, the second purpose of effectively removing residual substances remaining after the etching of the upper layer and of a high throughput is realized.

Furthermore, by inhibiting a progress of a side-etching phenomenon on the metal film utilizing the property that the etching using plasma provides comparatively high anisotropy and by obviating the need of removing the resist after the wet-etching of the metal film and before the etching using plasma which can avoid the etching of the surface of the metal film in a region where patterns are to be left utilizing the property that the plasma etching causes comparatively less damage to the resist, and by removing, even in a region where step-differences exist, residual substances left on a side of the region where step-differences exist using the property that the etching using plasma provides some isotropy, the third purpose of achieving accurate removal of the residual substances remaining after the etching of the metal film and of obtaining TFTs having, for example, high reliability and excellent characteristics is realized.

First Embodiment

Figure 1A:
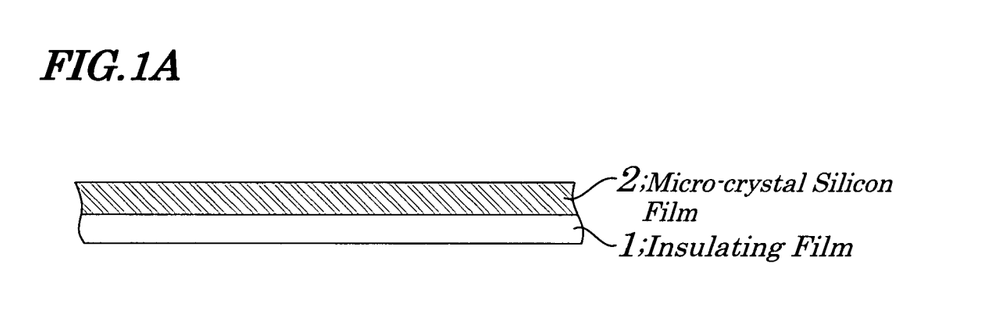
FIGS. 1A to 1C are process diagrams explaining a stacked film patterning method according to the first embodiment of the present invention.
Figure 1B:
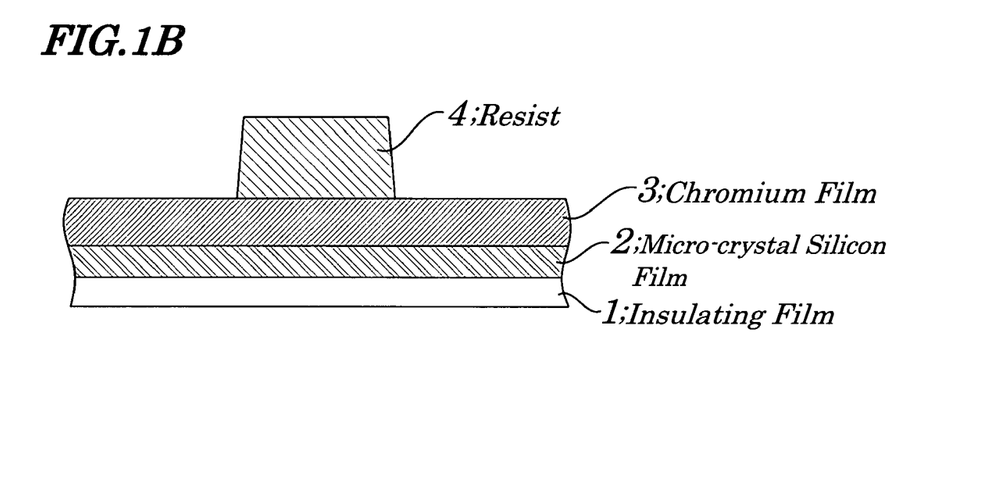
Figure 1C:
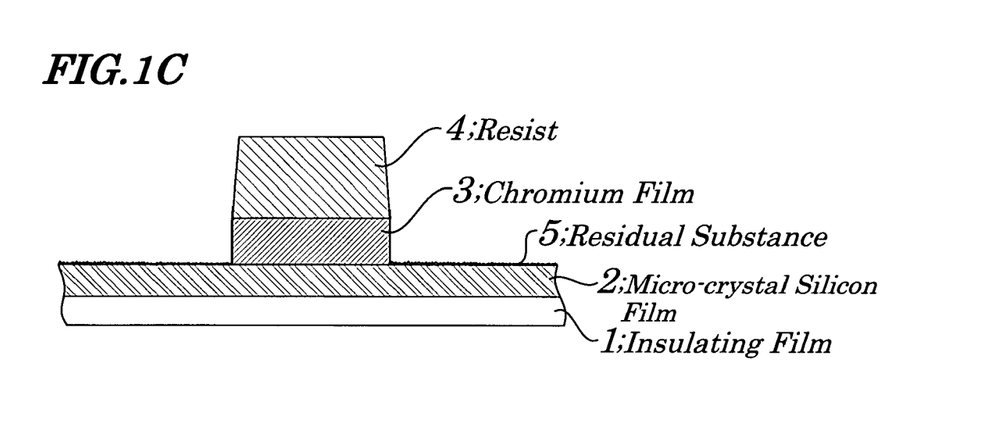
Figure 2A:
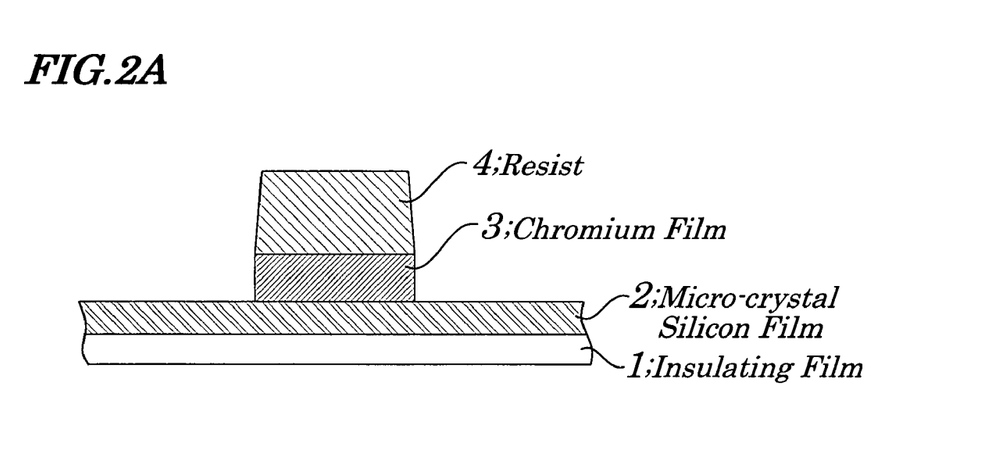
FIGS. 2A to 2C are also process diagrams explaining a stacked film patterning method according to the first embodiment of the present invention.
Figure 2B:
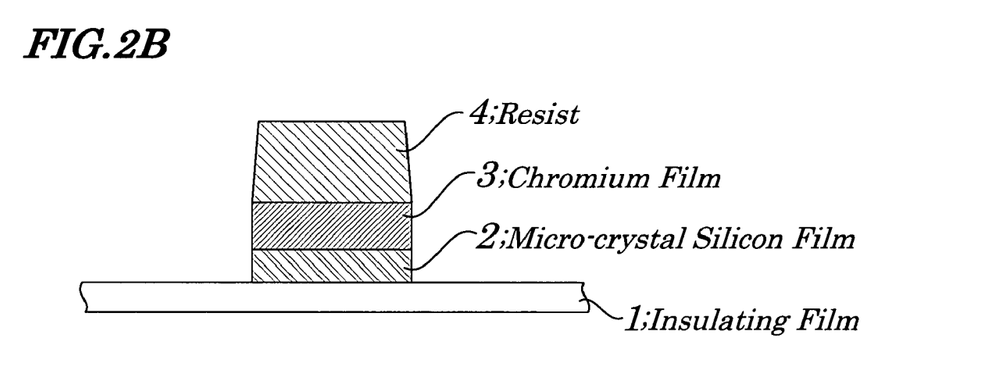
Figure 2C:
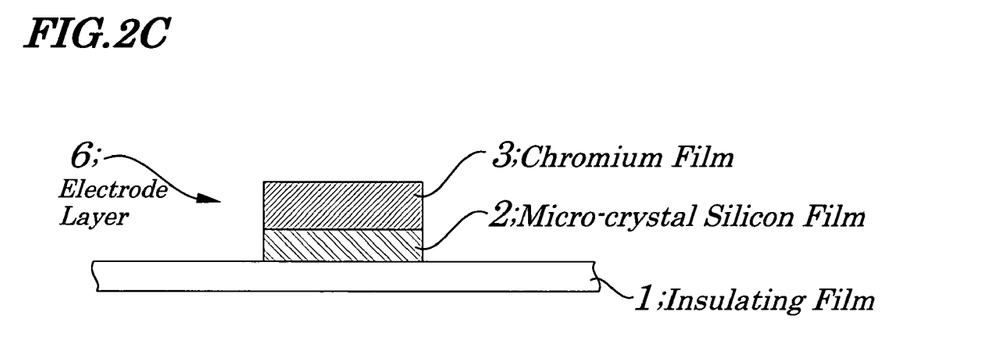
Figure 3:
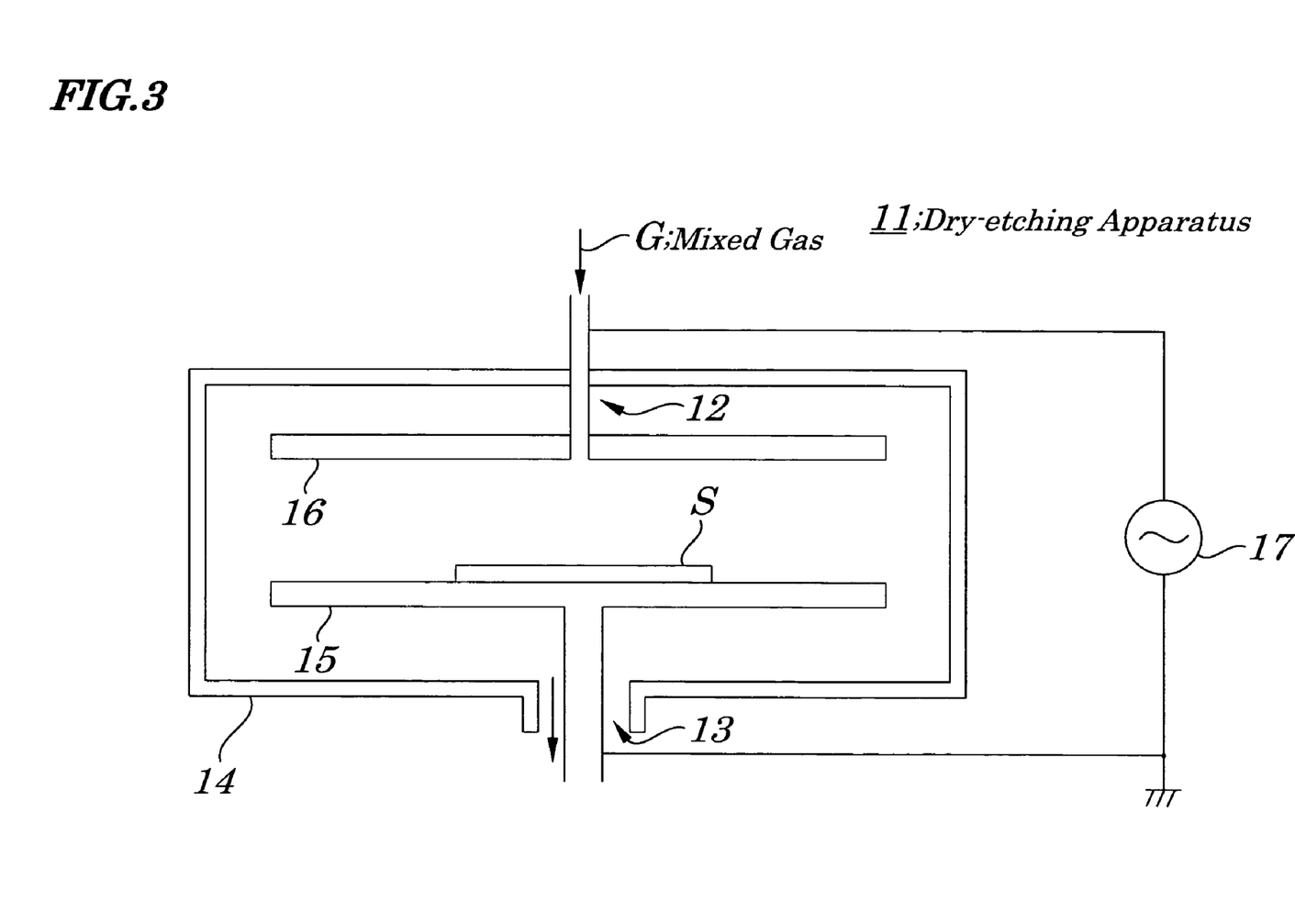
FIG. 3 is a diagram schematically showing configurations of a dry-etching apparatus to be used to perform the stacked film patterning method according to the first embodiment of the present invention.

FIGS. 1A to 1C are process diagrams explaining a stacked film patterning method of the first embodiment of the present invention. FIGS. 2A to 2C are also process diagrams explaining the stacked film patterning method of the first embodiment. FIG. 3 is a diagram schematically showing configurations of a dry-etching apparatus to be used to perform the stacked film patterning method of the first embodiment. The stacked film patterning method of the first embodiment is used to form an electrode layer 6 which is a stacked film having a two-layer structure in which a metal film is stacked on a silicon film deposited on an insulating film 1 formed on a substrate (see FIG. 2C).

First, as shown in FIG. 1A, an n-type micro-crystal silicon film 2 including phosphorus as an impurity is deposited as a silicon film so as to have a film thickness of about 100 nm by a PECVD (Plasma Enhanced Chemical Vapor Deposition)

method on the insulating film 1 made of silicon dioxide formed on a substrate. The micro-crystal silicon film 2 is a silicon film made up of a mixture of very fine silicon crystal grains having a crystal grain of 10 nm or less and amorphous silicon and is formed by the plasma CVD method. Next, by using a sputtering method, a chromium film 3 serving as a metal film is deposited so as to have a film thickness of about 200 nm.

Then, as shown in FIG. 1B, a resist 4 having a specified mask pattern is formed on the chromium film 3. Next, as shown in FIG. 1C, a chromium film 3 is patterned and is wet etched using the resist 4 as a mask and using, for example, an ammonium cerium nitrate etching solution. In this state, on a surface of the exposed micro-crystal silicon film 2 exist residues of metal chromium not removed by the wet etching or residual substances 5 of chromium silicide being a compound (compound of metal making up a boundary layer between an upper layer and lower layer with a conductive semiconductor) of chromium with silicon.

Next, active gas is produced through plasma reaction using mixed gas including chlorine ($Cl_2$) gas and oxygen ($O_2$) gas as material gas and plasma processing is performed, by using plasma of the active gas, on the micro-crystal silicon film on which residual substances 5 exist to selectively etch residual substances 5 existing on the surface of the micro-crystal silicon film 2 for removal, as shown in FIG. 2A. In the plasma processing, by using a parallel-plate type dry-etching apparatus as shown in FIG. 3, residual substances 5 are etched and removed under specified etching conditions.

The dry-etching apparatus 11 includes a vacuum container 14 having a gas introducing section 12 connected to a gas introducing unit to introduce a mixed gas G including chlorine gas and oxygen gas and an evacuating section 13 connected to an evacuating unit, a plate-shaped stage 15 mounted horizontally in the vacuum container 14 and connected to a terminal of a grounding potential which serves also as a lower electrode and on which a substance S to be processed is placed, a plate-shaped upper electrode 16, and an AC (alternate current) source 17 to apply an AC voltage with a specified frequency (for example, 13.56 MHz) between the upper electrode 16 and stage 15. Moreover, alternatively, the dry-etching apparatus that can be used includes a plasma etching-type apparatus and a reactive ion etching-type apparatus.

As one of etching conditions, a ratio of a gas flow rate of oxygen ($O_2$) gas to a gas flow rate of chlorine ($Cl_2$) gas is set to be preferably 30% to 300% (more preferably 50% to 200%). Chromium being the residual substance 5 reacts with both chlorine gas and oxygen gas to produce a compound with high volatility which reduces easy removal of chromium. To make chromium react with both the oxygen gas and chlorine gas for removal, a sufficient amount of the oxygen gas and chlorine gas is required and, in the case where the ratio of the above gas flow rate is less than 30%, that is, where the amount of the oxygen gas flowing per minute is too small or in the case where the above gas flow rate exceeds 300%, that is, where the amount of the oxygen gas flowing per minute is too larger, full removal of chromium cannot be achieved.

In the embodiment, the gas flow rate of chlorine gas is 240 sccm (standard cubic centimeter per minute) and the gas flow rate of oxygen gas is 160 sccm and, therefore, the ratio of the gas flow rate of oxygen gas to the gas flow rate of chlorine gas is $160/240$. Here, for example, "240 sccm" denotes 240 cc/min or 240 cm$^3$/min of a gas flow rate converted in a standard state. Moreover, the etching process in the embodiment is performed at a pressure of 10 Pa at 1000 W of power for a processing time of 60 sec. Moreover, alternatively, inert gas such as helium (He) gas or a like may be added.

Next, by using the dry-etching apparatus employed in the above plasma processing, as shown in FIG. 2B, the micro-crystal silicon film 2 is dry etched. At this point of time, the residual substance 5 left on a surface of the micro-crystal silicon film 2 are already removed and, therefore, high uniform etching is achieved with no etching residues left. In the dry-etching, as an etching gas to be used, gas such as gas of $Cl_2$ mixed with $CF_4$ gas or gas of HCl mixed with $SF_6$ gas which enables highly selective etching on the insulating film 1 serving as a front-end is applied.

However, since a surface of the micro-crystal silicon film 2 is oxidized by oxygen gas used at the time of removal by etching the residual substance 5, in the initial process, etching is carried out by using, for example, gas having low selectivity to the oxidized silicon film such as a mixed gas of $CF_4$ and $O_2$ or $SF_6$ and $O_2$ up to a midpoint of a thickness of the micro-crystal silicon film 2 (that is, so as to reach a specified depth out of a whole thickness of the micro-crystal silicon film 2) including the oxidized layer on the surface of the micro-crystal silicon film 2 and, thereafter, in the next process, the remaining micro-crystal silicon film 2 is etched by using gas which enables highly selective etching on the insulating film serving as the front-end. By this method, smooth etching is made possible with high uniformity being maintained. Next, as shown in FIG. 2C, the resist 4 is removed. Thus, the two-layer stacked film made up of the metal film formed on the silicon film serving as the electrode layer 6 is formed, for example, on the insulating film deposited on the substrate.

Thus, according to the method of the embodiment, when the micro-crystal silicon film 2 is dry etched after the wet-etching of the chromium film 3, a process is introduced which produces active gas through plasma reaction using the mixed gas including chlorine gas and oxygen gas as material gas and performs plasma processing on the micro-crystal silicon film 2 on which the residual substance 5 exists following the etching on the chromium film and, therefore, both the chromium being the residual substance and chromium silicide can be removed with reliability.

Thus, by introducing the method being highly capable of removing chromium, even when much non-silicidized chromium in a metal state is contained in the residual substance 5 which occur after the etching of the chromium film 3 deposited on the micro-crystal silicon film 2 on the surface of which fine concave and convex portions exist, the residual substance 5 can be removed by etching with stability and reliability.

In particular, by setting the ratio of a gas flow rate of oxygen gas to a gas flow rate of chlorine gas, being one of etching conditions, to be within a range between 30% to 300%, chromium being the residual substance 5 reacts fully with chlorine gas and oxygen gas and a compound having relatively high volatility is produced and, therefore, is easily removed, while the micro-crystal silicon which does not react with chromium is not etched and, as a result, chromium being the residual substance 5 leading to degradation in etching uniformity and the occurrence of etching residues in the process of etching of the micro-crystal silicon film 2 and chromium silicide are selectively etched and removed. This enables the residual substance 5 to be removed without causing the occurrence of ununiform distribution of the thickness of the micro-crystal silicon film 5 formed after the plasma processing. Therefore, the residual substances remaining after etching the metal film can be removed with reliability and uniformity in etching silicon films can be improved and the occurrence of etching residues can be prevented. As a result, an electrode layer having high reliability can be obtained.

Since successive and continuous dry etching of the micro-crystal silicon film 2 can be performed by using the same dry-etching apparatus as used in the plasma processing, a drop of a throughput caused by the addition of plasma processing is suppressed and a high throughput achieved by wet etching the metal film can be maintained. Since the plasma etching provides anisotropy being higher than that in the wet etching, no loss of an original shape of a pattern caused by the occurrence of a side-etching phenomenon on the chromium film 3 occurs during the plasma processing. Moreover, the plasma processing does not provide anisotropy being higher than that in the sputter-etching and rather some isotropy and, therefore, even in places where step-differences exist, the residual substance 5 on a side of the places where step-differences exist can be removed.

Moreover, since, in the plasma processing, damage caused to the resist 4 is relatively slight, no removal of the resist 4 is required before the plasma processing using the mixed gas including chlorine gas and oxygen gas as material gas after the wet-etching of the chromium film 3 and, therefore, a surface of the chromium film 3 in a region that needs to be left as a pattern is not etched. As a result, unexpected inconvenience of etching a region that needs to left can be prevented and the residual substance remaining after the etching of the metal film can be removed accurately. This enables an electrode layer with high reliability to be obtained.

Second Embodiment

Figure 4A:
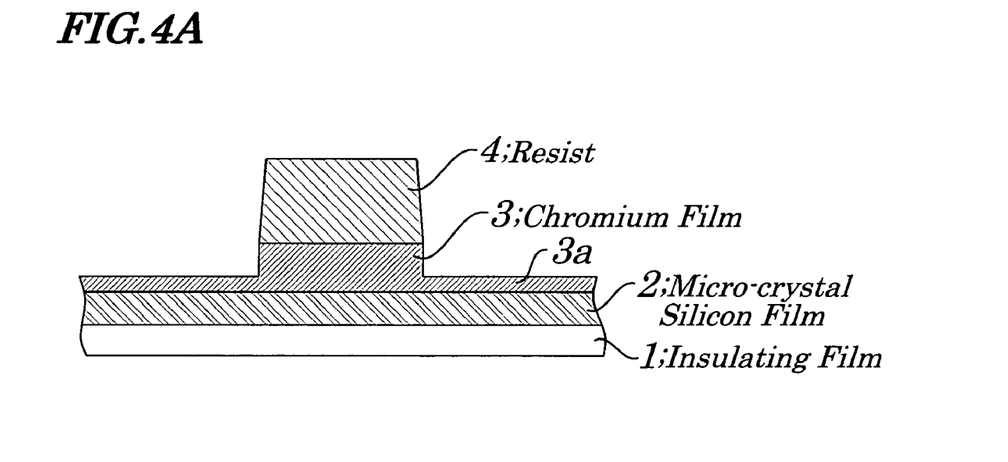
FIGS. 4A to 4C are diagrams explaining a stacked film patterning method according to the second embodiment of the present invention.
Figure 4B:
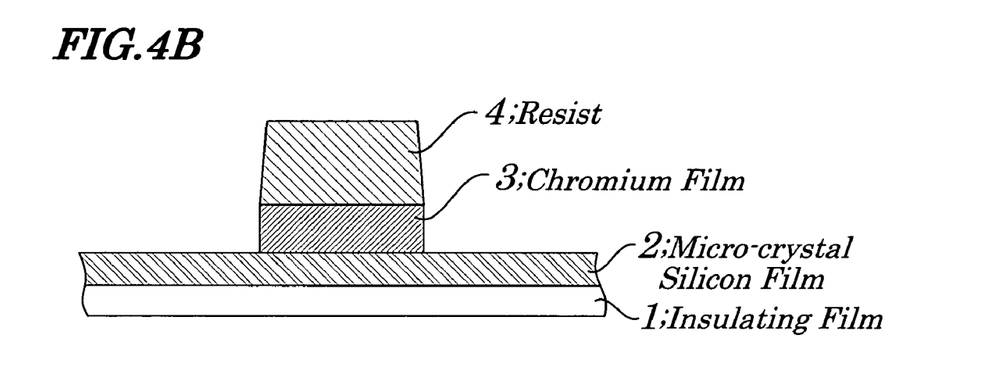
Figure 4C:
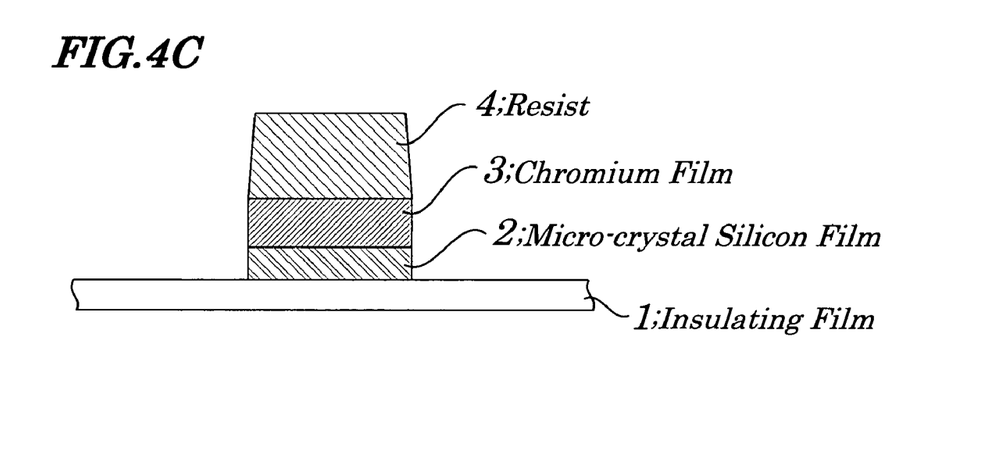

FIGS. 4A to 4C are diagrams explaining a stacked film patterning method according to the second embodiment of the present invention. The method of the second embodiment differs greatly from that of the first embodiment in that wet etching is performed to a mid point of a thickness of a chromium film (so as to reach a specified depth of the film). Configurations other than above are the same in the first embodiment and same reference numbers are assigned to components having the same function as in the first embodiment and their descriptions are simply made in FIGS. 4A to 4C accordingly.

First, as shown in FIG. 4A, a micro-crystal silicon film 2 as a silicon film is formed so as to have its film thickness of about 100 nm on an insulating film 1 made of silicon dioxide or a like. Next, a chromium film 3 as a metal film is deposited so as to have its film thickness of about 200 nm.

Then, the chromium film 3 is wet etched using a resist as a mask and using an ammonium cerium nitrate etching solution without being etched to an end of depth of the chromium film 3 (that is, to a degree to which a surface of the micro-crystal silicon film 2 is exposed) so that a non-etched portion of a chromium film 3a with a thickness of 10 nm to 50 nm is left. Next, by producing an active gas through plasma reaction using chlorine gas and oxygen gas as material gas and performing plasma processing on the left chromium film 3a using plasma of the active gas, as shown in FIG. 4B, the chromium film 3 is dry etched and patterned.

In the above plasma processing, as in the case of the first embodiment, the parallel-plate type dry-etching apparatus is used and, as the etching condition, a ratio of a gas flow rate of oxygen ($O_2$) gas to a gas flow rate of chlorine ($Cl_2$) gas is set to be preferably within a range from 30% to 300% (more preferably from 50% to 200%). In the second embodiment, the gas flow rate of the chlorine gas is 450 sccm and the gas flow rate of the oxygen gas is 300 sccm, and the gas flow rate of helium gas is 200 sccm and, therefore, the ratio of the gas flow rate of oxygen gas to the gas flow rate of chlorine gas is $300/450$. Moreover, the etching process in the second embodiment is performed at 30 Pa and 1500 W.

In the etching of the chromium film 3a under this condition, the etching rate is 35 nm/min. The processing time is adjusted depending on a film thickness of the chromium film 3a to be left or an end-point detecting means for the etching can be used. The end-point detecting means includes, for example, a method of using optical reflection such as laser beam interference, a method of a spectroscopic analysis to measure changes in strength of emission spectrum emitted from plasma.

Next, by using the dry-etching apparatus employed in the plasma processing, as shown in FIG. 4C, the micro-crystal silicon film 2 is dry etched. Thus, the two-layer stacked film made up of the metal film formed on the silicon film which serves as the electrode layer is formed.

The same effect as obtained in the first embodiment can be realized also in the second embodiment. Additionally, the chromium film 3 is wet etched to a mid point of a thickness of the chromium film 3 (that is, so as to reach a specified depth of the film) and, when the chromium film 3a remaining after the wet-etching is dry etched, an active gas is produced through plasma reaction using a mixed gas including chlorine gas and oxygen gas as material gas and plasma processing is performed using plasma of the active gas and, therefore, the occurrence of residues of metal chromium and/or residual substances made of chromium silicide can be prevented and thus smooth etching is carried out.

As a result, the micro-crystal silicon film 2 is dry etched without causing ununiform distribution of thickness of the micro-crystal silicon film 2 and without leaving etching residues. Moreover, the etching of the chromium film 3 is carried out by the combined use of the wet-etching and dry-etching and, therefore, unlike in the case in which the chromium film 3 is wet etched to an end of depth of the chromium film 3 (that is, to a degree to which the surface of the micro-crystal silicon film 2 is exposed), the occurrence of the side-etching phenomenon can be reduced.

Third Embodiment

FIGS. 5A, 5B, and 5C and FIGS. 6A, 6B, and 6C are process diagrams explaining a method of manufacturing polycrystalline TFTs according to the third embodiment of the present invention. The method of the third embodiment is a method for manufacturing a gate electrode making up a polycrystalline silicon TFT in which the stacked film patterning method provided in the first and second embodiments is used. As a gate electrode layer, two-layer stacked film made up of a metal film deposited on a silicon film is formed on a gate insulating film by patterning and, as a semiconductor layer, polycrystalline silicon (p-Si) is used.

Figure 5A:
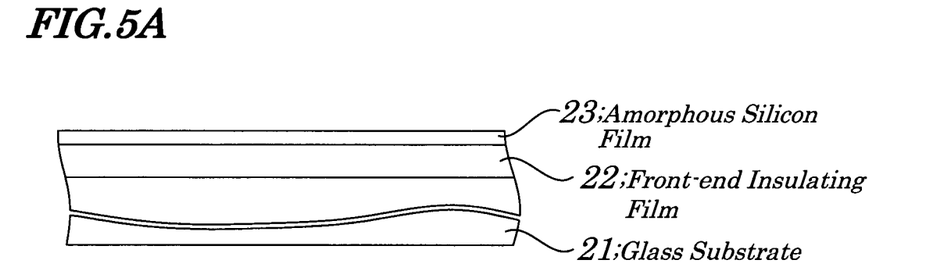
FIGS. 5A, 5B, and 5C are process diagrams explaining a method of manufacturing polycrystalline TFTs according to the third embodiment of the present invention.
Figure 5B:
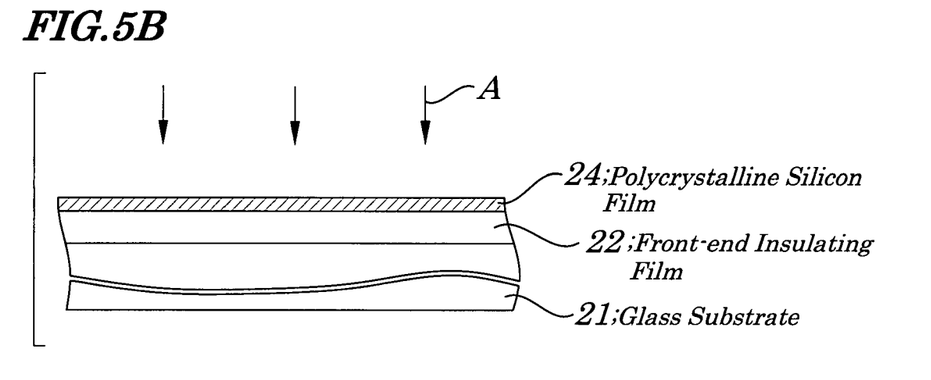

First, as shown in FIG. 5A, in order to prevent contamination caused by metal or a like on a glass substrate 21, a front-end insulating film 22 made of silicon dioxide or silicon nitride with its film thickness of about 300 nm is deposited on the glass substrate 21 by a plasma CVD or reduced pressure CVD. Next, an amorphous silicon (a-Si) film 23 is deposited, so as to have its film thickness of 50 nm, on the front-end insulating film 22 by the plasma CVD or reduced pressure CVD. Then, as shown in FIG. 5B, scanning radiation of, for example, an excimer laser beam A is performed on the amorphous silicon film 23 and a polycrystalline silicon (pSi) film as a semiconductor layer is formed. Next, as shown in FIG.

Figure 5C:
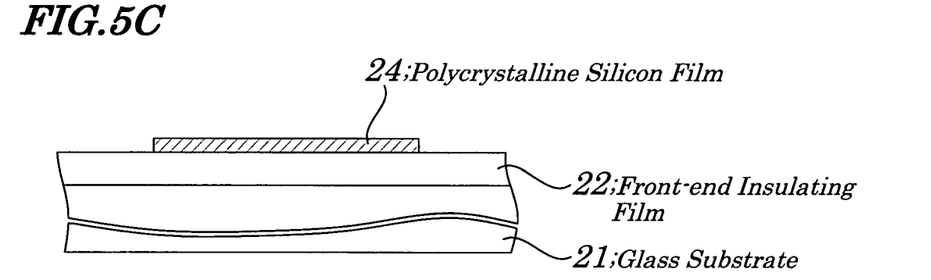

5C, the polycrystalline silicon film 24 is patterned by dry etching so as to have an island structure using a resist as a mask.

Figure 6A:
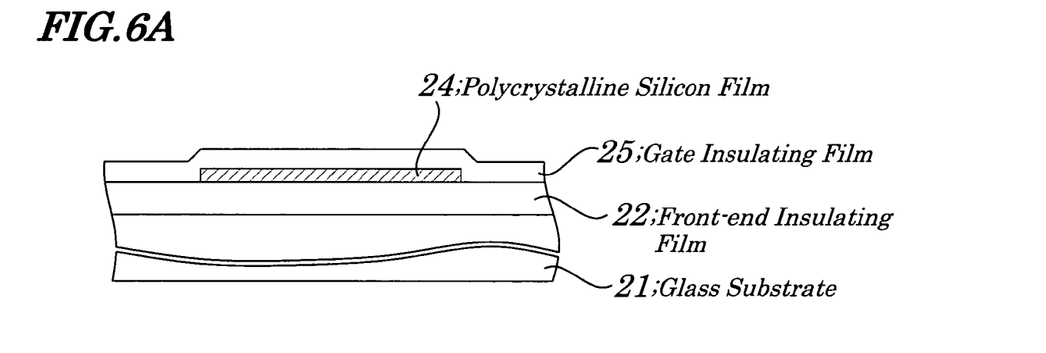
FIGS. 6A, 6B, and 6C are process diagrams explaining a method of manufacturing the polycrystalline TFTs according to the third embodiment of the present invention.
Figure 6B:
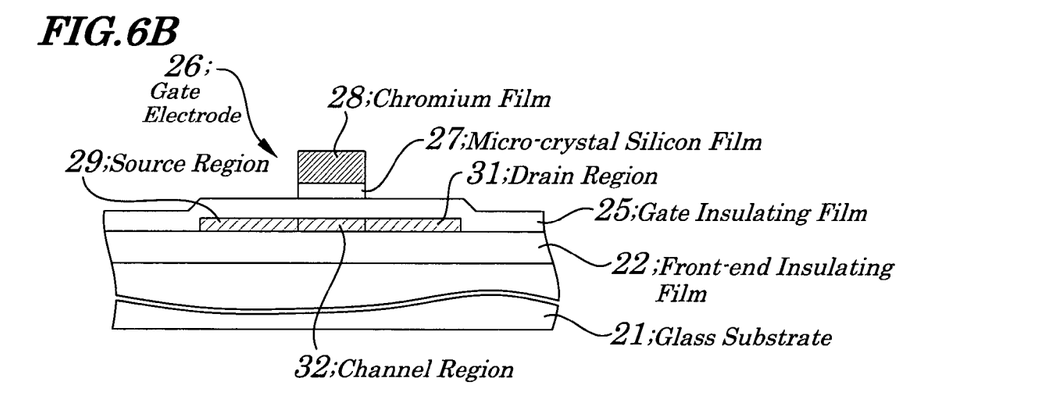

Then, as shown in FIG. 6A, on the polycrystalline silicon film 24 etched so as to form the island structure is deposited a gate insulating film 25 made of silicon dioxide with its film thickness of about 100 nm by the plasma CVD or reduced pressure CVD. Next, a gate electrode 26 is formed, as shown in FIG. 6B, by using the stacked film patterning method of the above first and second embodiments. The gate electrode 26 is made up of an n-type micro-crystal silicon film 27 with its film thickness of about 100 nm including phosphorus (P) as an impurity and a chromium film 28 with its film thickness of about 200 nm formed on the micro-crystal silicon film 27.

Next, by using the gate electrode 26 as a mask and implanting an impurity ion such as a phosphorus (P) ion or boron (B) ion into the polycrystalline silicon film 24 according to an ion implantation method or ion doping method and by performing heat treatment such as furnace annealing, laser annealing, or a like to activate the implanted impurity ion, a source region 29 and a drain region 31 are formed. Here, a channel region into which no impurity ion is implanted is formed immediately below the gate electrode 26.

Figure 6C:
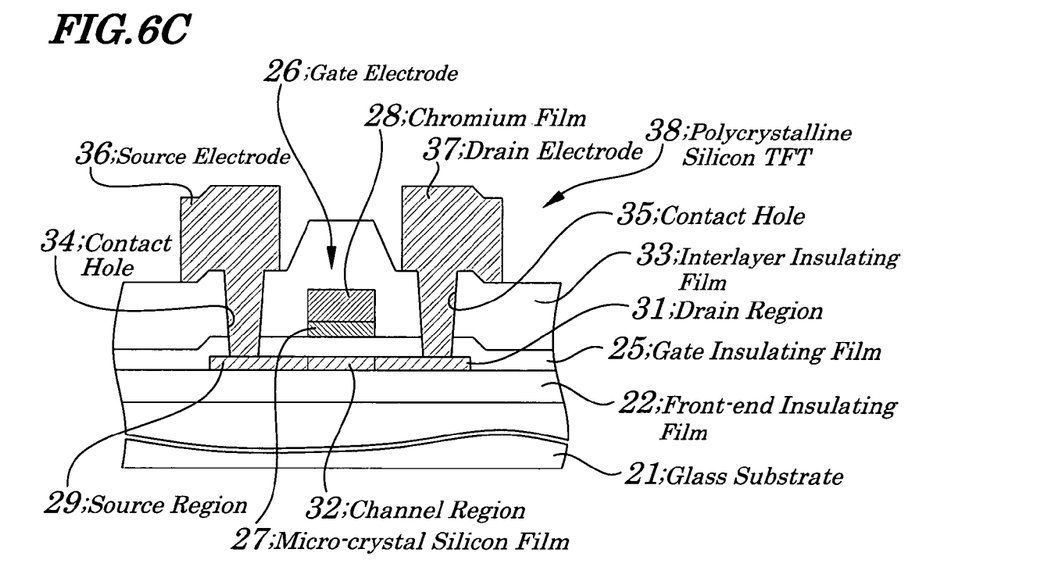

Then, as shown in FIG. 6C, an interlayer insulating film 33 made of silicon dioxide or silicon nitride with its film thickness of about 400 nm is formed by the plasma CVD. Next, the gate insulating film 25 and interlayer insulating film 33 are etched selectively by the dry-etching and by the combined use of the dry-etching and wet-etching methods using the resist as a mask to form contact holes 34 and 35.

Next, by a sputtering method, a metal film with its film thickness of about 500 nm made of chromium, Al (aluminum) alloy such as Al-2 atm % Si alloy, and other metal material is formed. Then, using the resist as a mask, the metal film is patterned and etched by the dry-etching or wet-etching method to form a source electrode 36 and a drain electrode 37 connected respectively to the source region 29 and drain region 31. Thus, the top-gate type polycrystalline silicon TFT using polycrystalline silicon as the semiconductor layer is obtained.

As described above, by employing the above methods, TFTs with high reliability and excellent characteristics can be obtained. That is, in the method of manufacturing the top-gate type polycrystalline silicon TFT, when the gate electrode having a stacked structure is formed, in the region where the polycrystalline silicon film serving as an active layer in the lower portion, the concave and convex portions existing on the surface of the micro-crystal silicon film become large in size due to influences by the concave and convex portion existing on the surface of the polycrystalline silicon film and, as a result, much metal-state chromium is contained in residual substances remaining after the wet-etching of the chromium film serving as an upper layer.

In such a situation, by the stacked film patterning method of the first and second embodiments described above, when the gate electrode is formed on the gate insulating film, plasma processing is performed on the micro-crystal silicon film by using the active gas produced through plasma reaction using a mixed gas including chlorine gas and oxygen gas and, therefore, ununiform distribution of thickness of the micro-crystal silicon film does not occur and residual substances can be removed by etching. As a result, uniformity of etching on the lower layer micro-crystal silicon film can be obtained without the occurrence of residues of etching.

Moreover, owing to improved uniformity of etching the micro-crystal silicon film, uniformity in engraving amounts of the front-end gate insulating film can be improved. Also, etching residues becoming a barrier in the impurity implantation process into the polycrystalline silicon film or in the process of contact hole formation can be eliminated. This enables TFTs having excellent characteristics to be obtained.

It is apparent that the present invention is not limited to the above embodiments but may be changed and modified without departing from the scope and spirit of the invention. For example, in the above embodiments, chromium is used as the metal film making up the gate electrode, however, alternatively, metal or alloy on which etching can be carried out by plasma produced by using a mixed gas including chlorine gas or oxygen gas as material gas may be used. Instead of chromium, for example, metal such as molybdenum, tungsten, tantalum, or a like may be used or alloy including, as chief compositions, chromium, molybdenum, tungsten, tantalum, or a like may be used as well.

Also, in the above embodiments, as the conductive semiconductor film making up the gate electrode, the micro-crystal silicon is used, however, other kinds of silicon including polycrystalline silicon, amorphous silicon, or a like may be used. Instead of polycrystalline silicon, germanium polycrystalline silicon may be used. In the above embodiments, the plasma CVD or reduced pressure CVD is used, however, for example, an atmospheric CVD method can be selected. Also, instead of chlorine gas, carbon tetrachloride may be used. In the second embodiment, the chromium film is wet etched to a mid point of a depth and the chromium film with a specified thickness is left and then plasma processing is carried out using the mixed gas including chlorine gas and oxygen gas, however, the chromium film may be etched to an end of the depth of the film by using plasma. In the above embodiments, the parallel plate-type dry-etching apparatus is used, however, a barrel (cylindrical) type dry-etching apparatus may be used. As the plasma etching unit, a plasma occurrence separating type unit may be used. As the reactive ion etching unit, a triode-type unit, unit applying magnetron, or unit applying a microwave may be used as well.

The present invention may be applied to the case where a semiconductor layer is formed by using not only polycrystalline silicon but also amorphous silicon. The present invention may be applied to the case where not only the gate electrode but also a wiring pattern made up of a conductive semiconductor film and metal film is formed generally.

What is claimed is:

1. A stacked film patterning method for obtaining a desired stacked film pattern by etching a stacked film comprising a lower layer film made of a conductive semiconductor and an upper layer film made of metal, said method comprising:

a first etching process of removing a specified region of said upper layer film made of said metal by using a wet-etching method;

a second etching process, following said first etching process, of removing residues of said metal not removed by said first etching process or a compound of said metal with said conductive semiconductor by using plasma of a mixed gas comprising chlorine gas and oxygen gas after completion of said first etching process; and a third etching process, following said second etching process, of removing said lower layer film made of said conductive semiconductor by using a dry-etching method after completion of said second etching process, wherein said conductive semiconductor is selected from the group consisting of micro-crystal silicon, polycrystalline silicon, amorphous silicon, and germanium polycrystalline silicon.

2. The stacked film patterning method according to claim 1, wherein said lower layer film is made of polycrystalline silicon or micro-crystal silicon and said upper layer film is made of metal selected from a group consisting of chromium, molybdenum, tungsten, and tantalum or of an alloy comprising said metal.

3. The stacked film patterning method according to claim 1, wherein a ratio of a flow rate of said oxygen gas to said chlorine gas is set to be within a range between 30% and 300%.

4. The stacked film patterning method according to claim 3, wherein said ratio of said flow rate is set to be within a range between 50% and 200%.

5. The stacked film patterning method according to claim 1, wherein said upper layer film is made of chromium, and ammonium cerium nitrate etching solution is used in said wet-etching method.

6. A gate electrode forming method for obtaining a desired gate electrode pattern by forming a stacked film comprising a lower layer film made of a conductive semiconductor and an upper layer film made of metal on a semiconductor film and gate insulating film deposited sequentially on a substrate and by etching said stacked film, said method comprising:

a first etching process of removing a specified region of said upper layer film made of said metal by using a wet-etching method;

a second etching process, following said first etching process, of removing residues of said metal or a compound of said metal not removed by said first etching process with said conductive semiconductor by using plasma of a mixed gas comprising chlorine gas and oxygen gas after completion of said first etching process; and a third etching process, following said second etching process, of removing said lower layer film made of said conductive semiconductor by using a dry-etching method after completion of said second etching process, wherein said conductive semiconductor is selected from the group consisting of micro-crystal silicon, polycrystalline silicon, amorphous silicon and germanium polycrystalline silicon.

7. The gate electrode forming method according to claim 6, wherein said upper layer film is made of chromium, and an ammonium cerium nitrate etching solution is used in said wet-etching method.

* * * * *